US008525168B2

(12) United States Patent
Dang et al.

(10) Patent No.: US 8,525,168 B2
(45) Date of Patent: Sep. 3, 2013

(54) INTEGRATED CIRCUIT (IC) TEST PROBE

(75) Inventors: Bing Dang, Chappaqua, NY (US); John U. Knickerbocker, Monroe, NY (US); Yang Liu, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 13/179,868

(22) Filed: Jul. 11, 2011

(65) Prior Publication Data

US 2013/0015440 A1 Jan. 17, 2013

(51) Int. Cl.
*H01L 23/58* (2006.01)

(52) U.S. Cl.
USPC ............... 257/48; 438/52; 438/689; 438/694; 438/696; 257/734; 257/E23.01

(58) Field of Classification Search
USPC ................. 438/694, 719, 734–736, 689, 696, 438/52; 257/734, 48, E23.01
See application file for complete search history.

(56) References Cited

U.S. PATENT DOCUMENTS

| | | | | |
|---|---|---|---|---|
| 5,027,062 | A * | 6/1991 | Dugan et al. | 324/750.29 |
| 5,519,582 | A * | 5/1996 | Matsuzaki | 361/783 |
| 5,608,264 | A * | 3/1997 | Gaul | 257/734 |
| 5,618,752 | A * | 4/1997 | Gaul | 438/626 |
| 5,627,106 | A * | 5/1997 | Hsu | 438/459 |
| 5,646,067 | A * | 7/1997 | Gaul | 438/458 |
| 5,844,364 | A * | 12/1998 | Beardmore | 313/522 |
| 6,498,381 | B2 * | 12/2002 | Halahan et al. | 257/449 |
| 6,622,103 | B1 * | 9/2003 | Miller | 702/89 |
| 6,642,081 | B1 * | 11/2003 | Patti | 438/109 |
| 6,911,814 | B2 * | 6/2005 | Miller et al. | 324/750.01 |
| 7,144,757 | B1 * | 12/2006 | Grassl | 438/108 |
| 7,178,236 | B2 * | 2/2007 | Gleason et al. | 29/874 |
| 7,214,615 | B2 * | 5/2007 | Miyazawa | 438/667 |
| 7,354,798 | B2 * | 4/2008 | Pogge et al. | 438/109 |
| 7,407,823 | B2 * | 8/2008 | Hasebe et al. | 438/17 |
| 7,459,399 | B2 * | 12/2008 | Kim et al. | 438/694 |
| 7,514,944 | B2 * | 4/2009 | Smith et al. | 324/755.09 |
| 7,833,895 | B2 * | 11/2010 | Bonifield et al. | 438/598 |
| 7,872,357 | B2 * | 1/2011 | Yu et al. | 257/777 |
| 7,928,750 | B2 * | 4/2011 | Miller | 324/754.21 |
| 8,138,020 | B2 * | 3/2012 | Gruber et al. | 438/108 |
| 8,158,489 | B2 * | 4/2012 | Huang et al. | 438/455 |
| 8,206,602 | B2 * | 6/2012 | Kimura et al. | 216/22 |
| 8,283,755 | B2 * | 10/2012 | Hayasaka et al. | 257/621 |
| 2003/0186548 | A1 * | 10/2003 | Brenner | 438/689 |
| 2004/0097004 | A1 * | 5/2004 | Pogge et al. | 438/52 |
| 2005/0136635 | A1 * | 6/2005 | Savastiouk et al. | 438/597 |
| 2006/0214302 | A1 * | 9/2006 | Matsuo | 257/758 |
| 2007/0152685 | A1 * | 7/2007 | Eldridge et al. | 324/754 |

(Continued)

*Primary Examiner* — N Drew Richards
*Assistant Examiner* — Ankush Singal
(74) *Attorney, Agent, or Firm* — Law Office of Charles W. Peterson, Jr.; Louis J. Percello, Esq.

(57) ABSTRACT

A test probe head for probing integrated circuit (IC) chips and method of making test heads. The test head includes an array of vias (e.g., annular vias or grouped rectangular vias) through, and exiting one surface of, a semiconductor layer, e.g., a silicon layer. The vias, individual test probe tips, may be on a pitch at or less than fifty microns (50 μm). The probe tips may be stiffened with $SiO_2$ (and optionally silicon) extending along the sidewalls. A redistribution layer connects individual test probe tips externally. The probe tips may be capped with a hardening cap that also caps stiffening $SiO_2$ and silicon along the tip sidewall.

25 Claims, 11 Drawing Sheets

(56) References Cited

U.S. PATENT DOCUMENTS

| | | | | |
|---|---|---|---|---|
| 2008/0211525 | A1* | 9/2008 | Garabedian et al. | 324/758 |
| 2008/0237877 | A1* | 10/2008 | Morikawa et al. | 257/773 |
| 2009/0191708 | A1* | 7/2009 | Kropewnicki et al. | 438/667 |
| 2010/0068837 | A1* | 3/2010 | Kumar et al. | 438/17 |
| 2010/0102838 | A1* | 4/2010 | Kitazume et al. | 324/754 |
| 2010/0140793 | A1* | 6/2010 | Fan et al. | 257/734 |
| 2010/0171226 | A1* | 7/2010 | West et al. | 257/774 |
| 2011/0215443 | A1* | 9/2011 | Hayasaka et al. | 257/621 |
| 2012/0001337 | A1* | 1/2012 | Tsai et al. | 257/770 |
| 2012/0080595 | A1* | 4/2012 | West | 250/307 |
| 2012/0086122 | A1* | 4/2012 | Cheng et al. | 257/738 |
| 2012/0212248 | A9* | 8/2012 | Chong et al. | 324/754.07 |
| 2012/0217611 | A1* | 8/2012 | Liu et al. | 257/508 |

* cited by examiner

INTEGRATED CIRCUIT (IC) TEST PROBE

BACKGROUND OF THE INVENTION

1. Field of the Invention

The present invention is related to semiconductor device manufacturing and more particularly to test probes for testing semiconductor integrated circuit (IC) chips.

2. Background Description

As is well known in the art, typical semiconductor integrated circuit (IC) chips have layers stacked such that layer features overlay one another to form individual devices and connect devices together. ICs are mass produced by forming an array of chips on a thin semiconductor wafer. Each array location is known as a die and each die may harbor a multi-layered structure, such as an IC chip or a structure for test or alignment. The surface layer of each chip or die is typically populated by probable off-chip pads for connecting to chip power and input/output (I/O) signals.

As transistor technologies have evolved, chip features and devices have gotten smaller and smaller and have minimum dimensions that typically are well below one micrometer (1 μm) or 1 micron. Smaller chip features and devices allow IC manufacturers to integrate more function in the same chip real estate. Packing more function on each die typically means providing more and more I/O signals for each die. Each die has at least one surface pad for each I/O signal and a number of power (supply and ground) connection pads. Providing these I/O signals and supply as die are shrinking in size, therefore, drives more stringent off-chip I/O connection requirements, i.e., increasingly dense I/O pad arrays. On a typical state of the art IC wafer, for example, the surface layer of each die may be populated by several thousand connection pads. To achieve this requires ultra-fine pitch pads on very tight a pitch less than 50 microns (<50 μm).

Further, these very densely packed chip pads may also be populated with solder balls, most commonly lead-tin (PbSn) solder. The solder balls, e.g., controlled collapsible chip connections (C4s), are formed or bumped onto the pads, for example, for what is known as ball grid array (BGA) joining.

Testing these tightly packed pads with or without solder balls requires very fine, delicate, tightly-packed test probes. These densely packed state of the art probes are typically electroplated copper (Cu) tips coated with hard conductive coatings. Probing tightly-packed pads requires very precise probe tip geometry control and scalability.

Achieving necessary probe tip precision for probing ultra-fine pitch pads has proven very difficult, and therefore, expensive. Moreover, probes tend to distort mechanically with use. This distortion can make initially adequate spacing uneven. Also, copper and nickel probes have been prone to tin contamination that is especially pronounced when used on high-tin alloy solders. This contamination can cause probe misalignment and, if severe enough, probe shorts.

Thus, there is a need for a low cost probe for probing ultra-fine pitch pads and that is not sensitive to tin contamination.

SUMMARY OF THE INVENTION

A feature of the invention is a low cost test probe for probing integrated circuit (IC) chips;

Another feature of the invention is a method of manufacturing low cost IC test probes that are insensitive to tin contamination;

Yet another feature of the invention is a low cost test probe for wafer probing IC chips and chip pads that are on a pitch tighter than 50 μm.

The present invention relates to a test probe head for probing integrated circuit (IC) chips and method of making test heads. The test head includes an array of vias (e.g., annular vias or grouped rectangular vias) through, and exiting one surface of a silicon layer. The vias, individual test probe tips, may be on a pitch at or less than fifty microns (50 μm). Optionally, the probe tips may be stiffened with silicon oxide ($SiO_2$) and optional silicon extending along the sidewalls. A redistribution layer connects individual test probe tips externally. The probe tips may be capped with a hardening metal, e.g., a tungsten and/or a hardening cap, that also caps any optional stiffening material such as $SiO_2$ and/or silicon along the tip sidewall.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
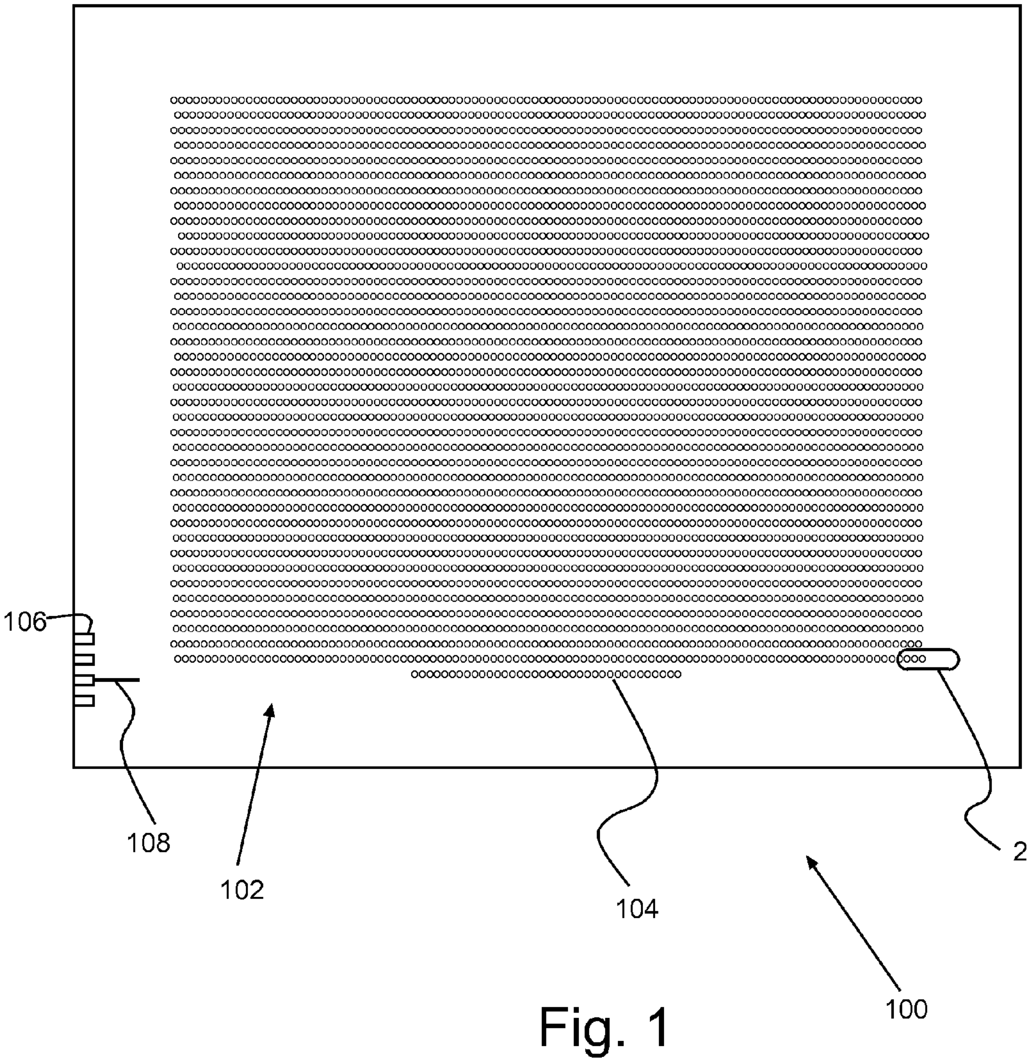
FIG. 1 shows an example of a preferred probe head for testing high density input/output (I/O) pads according to a preferred embodiment of the present invention.

Turning now to the drawings and, more particularly, FIG. 1 shows an example of a preferred probe head 100 for testing high density input/output (I/O) pads, e.g., on Integrated Circuit (IC) chips and on state of the art interconnects for such IC chips according to a preferred embodiment of the present invention. Preferred probe head 100 includes an array 102 of Through Silicon Vias (TSVs) as 104 probe pads that may be on a pitch at or less than fifty microns (50 μm). Lands 106 for external probe connections are located on either side of the wafer, connecting external signals and power (not shown) to individual pads 104 through surface and sub-surface wiring 108. Lands 106 may be typical IC pads for peripheral wire bonding or for forming a C4 array. Wiring 108 are typically on a much closer pitch than the pads 104, typically more than an order of magnitude less. Also, although only four (4) lands 106 are shown in this example, typically, there is at least one land 106 for each probe 104. In addition support circuits, e.g., IC switches and gates (not shown), may be formed on the wafer for each die as desired.

Preferred probe heads 100 have application to test probing chips stacked in three dimensional (3D) packages to maximize performance and density. This 3D packaging uses what is known as 3D TSV structures/connections to connect multiple stacked chips in a single package. 3D-TSV packaging reduces the form factor and power consumption for the contained function. 3D-TSV packaging also increases inter-chip communication bandwidth because it eliminates connections through a circuit board, e.g., for mobile advanced devices like tablets and smartphones. However, a single bad chip in the stack makes the stack defective chip.

Consequently, it is important to use only chips and TSV layers that are selected from known good die (KGD). Identifying these known good die at wafer (i.e., before dicing the wafer), requires the high wafer test coverage achieved using a preferred probe 100 with probe tips that are dense enough to probe the densely arrayed signal pads on state of the art chips and/or TSV layers. TSV connections in a preferred probe head 100 meets these needs with an array 102 of TSV surface probe pads 104 on the same pitch as IC chip pads.

So, preferably each TSV probe head 100 is manufactured/customized for use, i.e., to match the chip/TSV structure intended for probing (the device under test (DUT)). Thus for full chip test, at least the array 102 of surface pads or probe tips 104 sufficiently covers the pads on the DUT. So, the preferred full chip test probe head 100 is only marginally larger than DUT, e.g., less than an order of magnitude larger and typically, and preferably less than twice the size. Alternately, a probe head for probing less than all of the DUT pads may be substantially smaller than the DUT. Also, although shown as square or rectangular, this is for example only. Both a preferred probe head 100 and the probe tips 104, may have any shape as selected by design or suitable for the particular DUT.

Figure 2A:
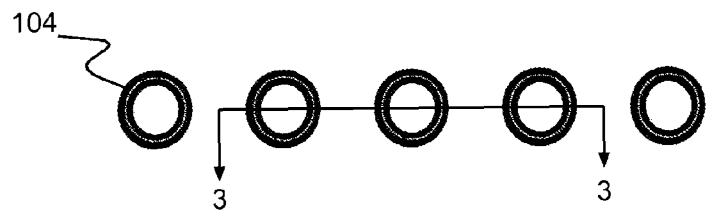
FIGS. 2A-C show expanded examples of patterns for TSVs.
Figure 2B:
Figure 2C:
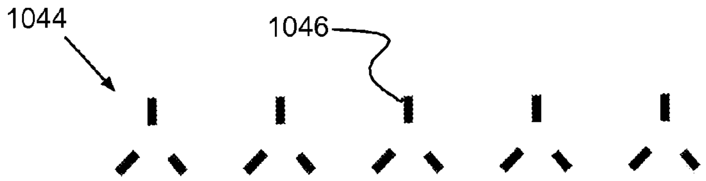

FIGS. 2A-C show expanded examples of patterns for TSVs 104, 1042, 1044 in area 2 of FIG. 1. Thus, for 50 μm pitch pad probing for example, the preferred probe may be an array 102 of annular TSVs 104 or an arrangement or group 1042, 1044 of bars 1046. Annular TSVs 104 have a radius that is less than half the array pitch and preferably, 1-10 μm radius and a 1-2 μm thick wall. Preferably also, the radial bars 1046 are 7-10 μm long rays in radii of a annulus/circle with a radius less than 10 μm. It should be noted that these TSVs 104, 1042, 1044, are for example only. TSVs (and probe tips) in an array 102 need not be uniformly shaped throughout a probe array 102 or uniformly spaced and different shapes may be intermixed on a single preferred probe head 100.

Figure 3:
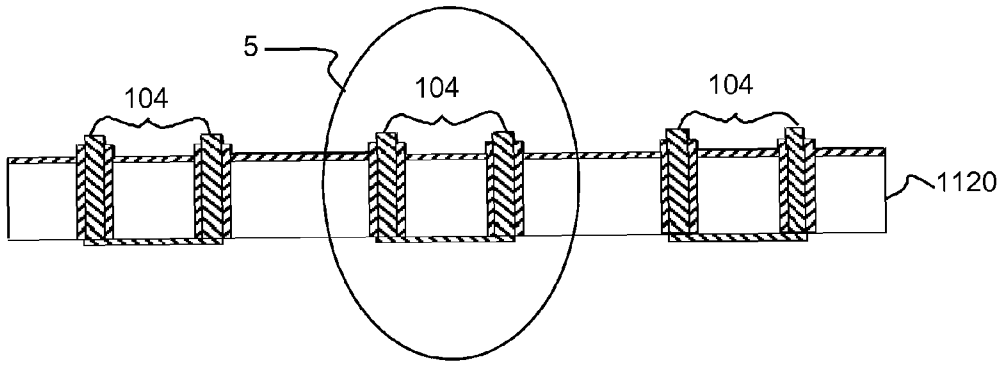
FIG. 3 shows a cross sectional example of a semiconductor wafer with probe TSVs cased in dielectric.

FIG. 3 shows a cross sectional example of a semiconductor wafer with probe TSVs 104 cased in dielectric, e.g., at 3-3 in FIG. 2A for forming a probe according a preferred embodiment of the present invention.

Figure 4:
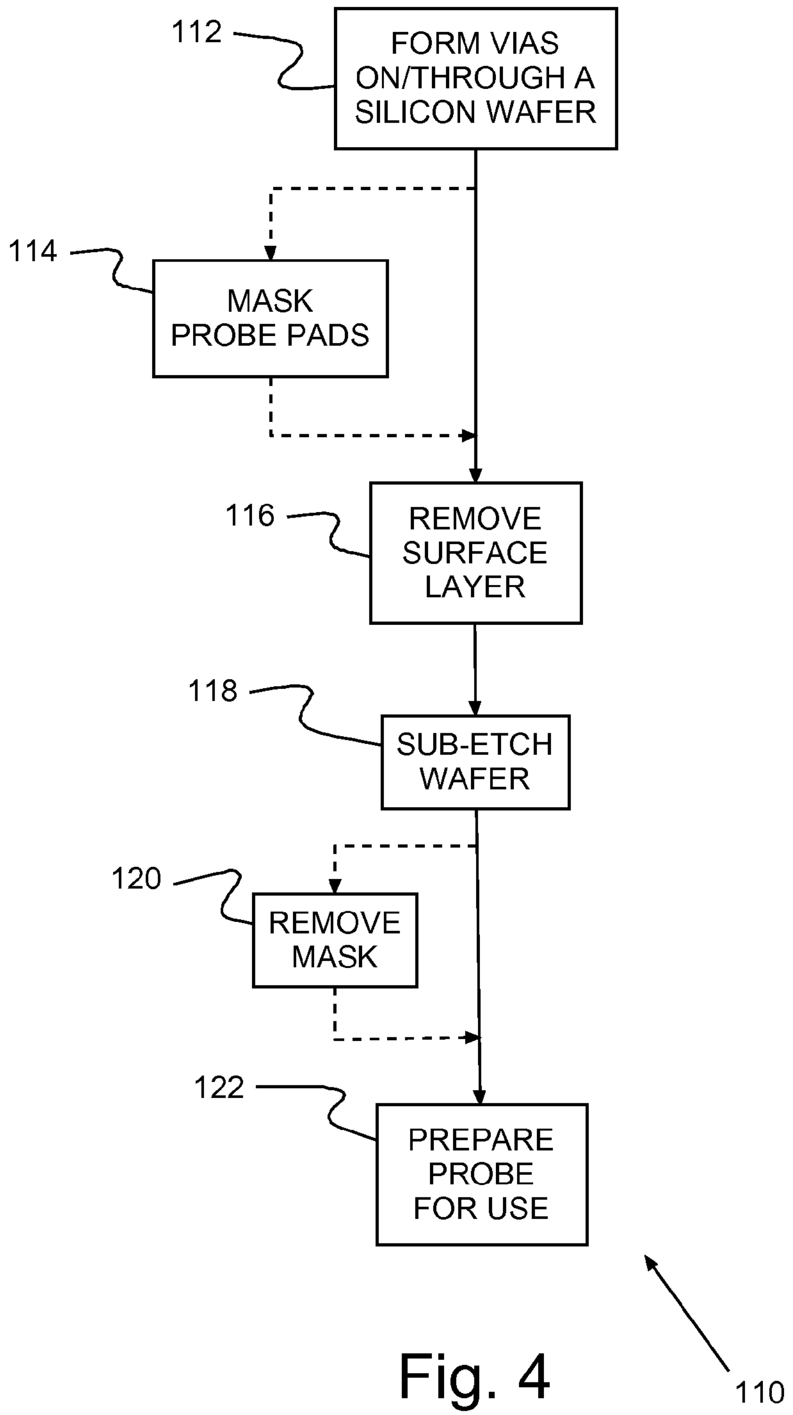
FIG. 4 shows steps in forming preferred TSV connection probe heads.

FIG. 4 shows steps 110 in forming preferred TSV connection probe heads 100 of FIG. 1. In 112 probe vias 104, cased in dielectric, are formed in or through a semiconductor wafer (e.g., a silicon (Si) wafer). The wafer 1120 may be covered with a surface dielectric layer. Optionally in 114, a photoresist/hard resist mask may be formed on the vias 104 for subsequently notching via tips and/or for thickening subsequently exposed/defined TSV probe sidewalls. Surface dielectric layer is removed in 116 to expose the semiconductor wafer 1120 and the tips of the TSVs. In 118 the semiconductor wafer is sub-etched such that TSV probes extend from the sub-etched surface. If the TSVs were masked, the masked vias may also be etched as the semiconductor is sub-etched or prior to sub-etching, e.g., using a wet etch or a Reactive Ion Etch (RIE) to form notches in the probe tip end. In 120 the optional mask (if used) is removed to re-expose the upper end of the notched TSVs. In 122 the finished probe is prepared for use, e.g., for manufacturing in probing of IC chips on wafers.

Figure 5A:
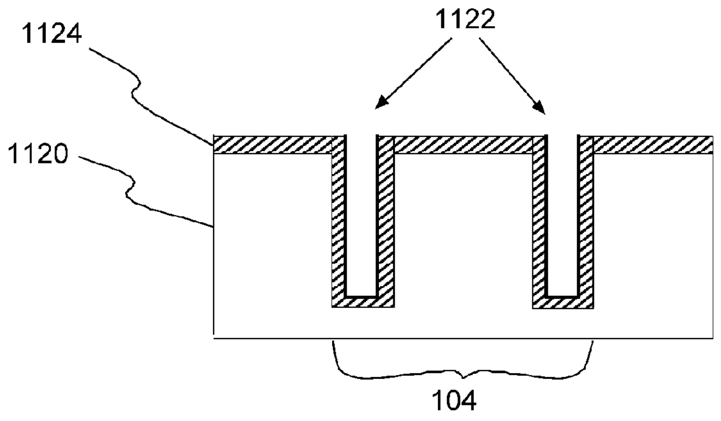
FIGS. 5A-C show a detailed example of forming blind vias for forming preferred TSVs.
Figure 5B:
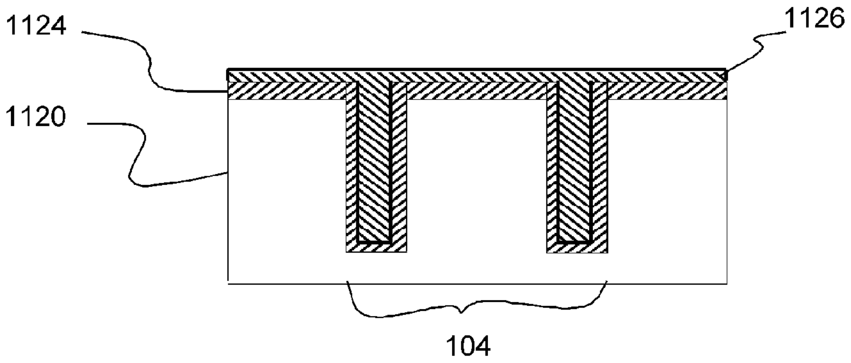
Figure 5C:
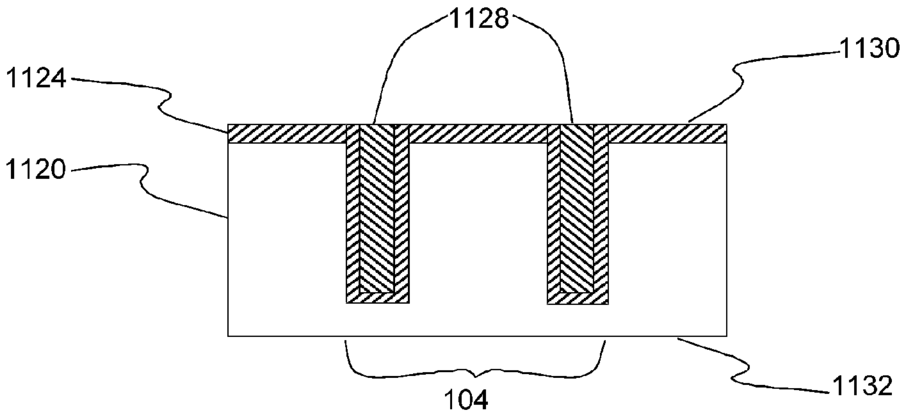

FIGS. 5A-C show in detail forming blind vias for forming preferred TSVs 104 in area 5 of FIG. 3 according to the method of FIG. 4. So, in 112, probe TSVs 104 are formed through semiconductor (e.g., silicon) wafer 1120. TSV formation begins by opening vias 1122 into, but not completely through, the wafer 1120. Preferably, for 2-20 μm wide (diameter) annular vias 1122 with 1-3 μm thick walls, 1-3+ μm wide vias or trenches 1122, formed 50-100 μm deep into, but not through, the silicon wafer 1120. It should be noted that narrower pitch TSVs, e.g., 10 μm, are shorter than TSVs on a 50 μm, e.g., formed 10 μm deep into, but not through, the silicon wafer 1120.

A dielectric layer 1124 at least 0.1 μm thick is formed on the wafer surface, onto via sidewalls and the bottom of the vias to completely coat the vias. Preferably, the dielectric layer 1124, e.g., a silicon dioxide ($SiO_2$) layer, is formed by oxidizing the silicon surface, e.g., in steam. Next a conductive layer 1126 is formed, e.g., depositing metal, on the wafer 1120 to fill the vias 1122. The conductive surface layer 1126 is removed to define the TSVs 104, e.g., using a suitable chemical-mechanical (chem-mech) polish (CMP). After removing the conductive surface layer 1126 in FIG. 5C, the conductive vias (TSVs) 1128, e.g., copper (Cu) or tungsten (W), extend through dielectric layer 1124 from the top side surface 1130.

As described hereinbelow, a preferred test head 100 may be fabricated from either side (top 1130 or bottom 1132) of a wafer 1120 thus formed. Preferably, each silicon wafer 1120 also includes and provides signal distribution and especially, power distribution, to the probe vias 104.

Figure 6A:
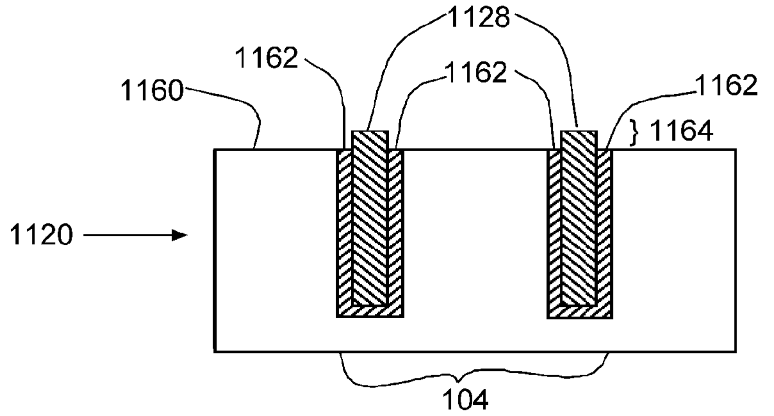
FIGS. 6A-C shown an example of defining test probe tips from the top side of a wafer.
Figure 6B:
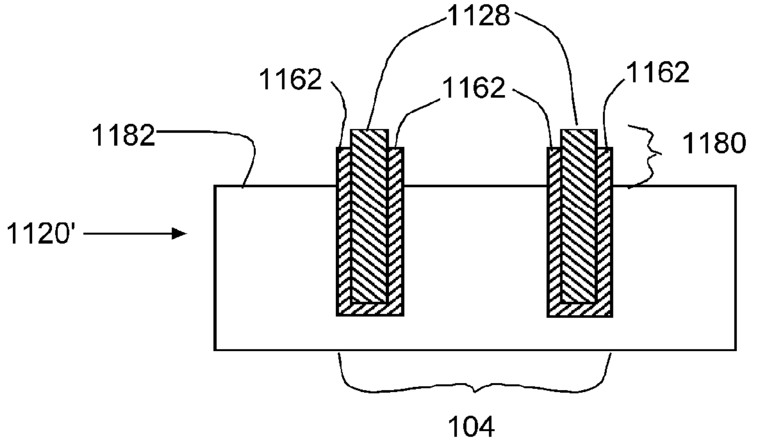
Figure 6C:
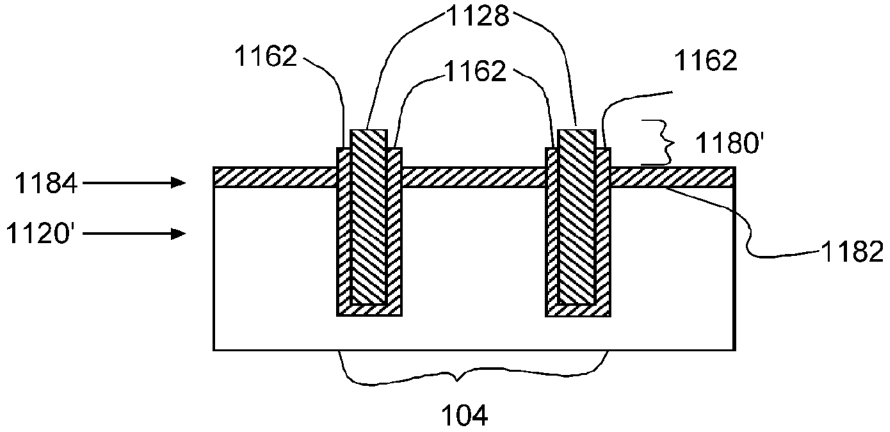

Having formed the probe vias 104 cased in dielectric 1124 in semiconductor wafer 1120, test probe tips 104 are defined for the top side 1130 example as shown in FIGS. 6A-C, with reference to FIGS. 5A-C, and as described for 116 and 118 in FIG. 4. So, in 116 the surface dielectric layer 1124 is removed to expose the surface 1160 of the wafer 1120 in FIG. 6A. As a result, the conductive TSVs 1128 encased in dielectric 1162 have tips 1164 exposed above the surface 1160.

In 118 as shown in FIG. 6B the wafer is sub-etched to expose a TSV section 1180 above the sub-etched surface 1182. The metal TSVs 1128 remain encased in dielectric casing 1162. Optionally in FIG. 6C, a thin insulation layer 1184, e.g., 1-2 μm thick, may be formed on the sub-etched wafer 1120'. Thus, probe tips 1180, 1180' are formed on wafer 1120 probe heads. Each probe head 100 may be a single die on the wafer 1120 or, optionally, the whole wafer 1120.

Figure 7A:
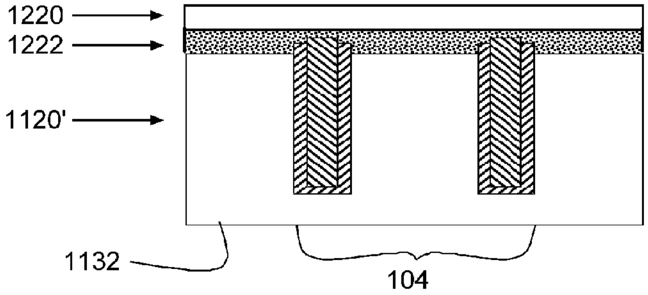
FIGS. 7A-B show preparing the finished probe for use, e.g., for manufacturing probing of IC chips on a wafer.
Figure 7B:
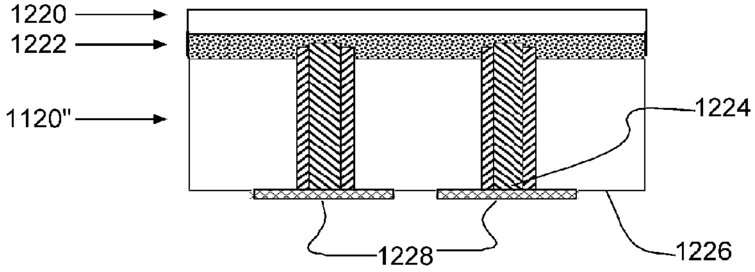

FIGS. 7A-B show preparing the finished probe for use 122, e.g., for probing of IC chips on wafers during manufacturing. First, a handle layer 1220 or wafer is adhesively attached to the sub-etched surface 1182 or to the (optional) surface dielectric layer 1184, if used. The handle layer 1220 is attached with an adhesive layer 1222 that is thicker than the probe tips 1180 (or 1180' in FIG. 6C), and preferably 20 μm thick. After the handle layer 1220 is attached, the wafer may be inverted and the bottom 1132 of the wafer is removed, etched or polished away, to the end 1224 of the TSVs 104 (formerly the bottom end of the TSVs 104), which are at the top 1226 of the inverted wafer 1120". With the top ends 1224 of the probes exposed, wires 1228 are formed in one or more layers on the top 1226 of the wafer. The wires 1228 include lands and wiring connecting the lands to individual probes 104.

Finally, the wafer 1120" may be diced and the handle layer 1220 is removed to separate individual probe heads 100 from each other or, if the probe head 100 occupies the entire wafer 1120", the probe head 100 may be trimmed for use. Preferably, the diced probe head 100 includes wiring and lands, e.g., located peripherally and on either surface or sub-surface, for connecting externally to the TSV probes 104. The diced probe head 100 is mounted in a test fixture, e.g., socket mounted, edge mounted and/or soldered or wire bonded to the test fixture (not shown). The test fixture, selected based on an intended test system, is mounted in the selected test system for testing chips, e.g., for wafer probing IC chips during manufacturing and probing post bumping.

FIGS. 8A-D show an example of defining test probe tips 104 defined on the bottom side 1132 of the structure of FIG. 5C, and as described for 116 and 118 in FIG. 4. Since the probe tips are being formed on the bottom side 1132, the top side 1130 is the top of the probe head. Thus, formation begins by forming wires 1134 in one or more layers on the top 1130 of the wafer 1120. Then, a handle layer 1136 is attached with an adhesive layer 1138 to the top 1130 of the wafer. Again after the handle layer 1136 is attached, the wafer is inverted and the bottom 1132 of the wafer is removed, e.g., etched or polished away to surface 1166 at the bottom end 1168 of the TSVs 104 in FIG. 8B.

Figure 8A:
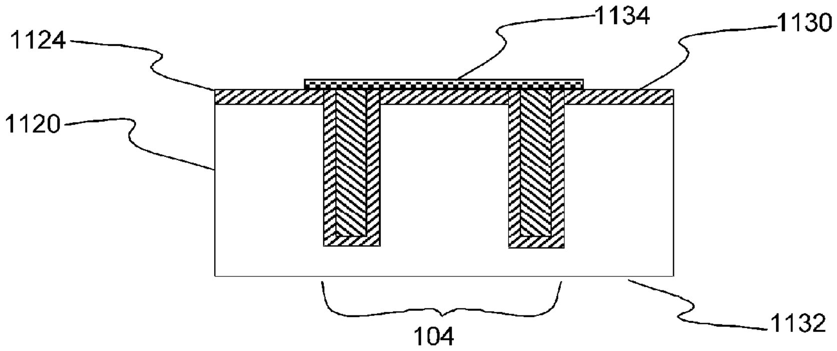
FIGS. 8A-D show an example of defining test probe tips from the bottom side of a wafer.
Figure 8B:
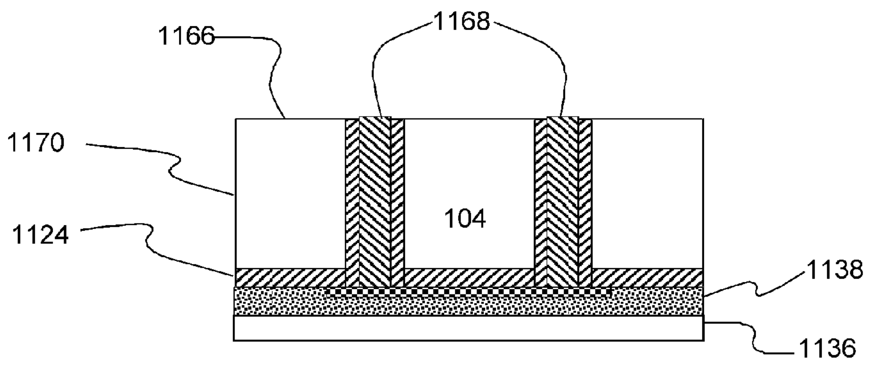
Figure 8C:
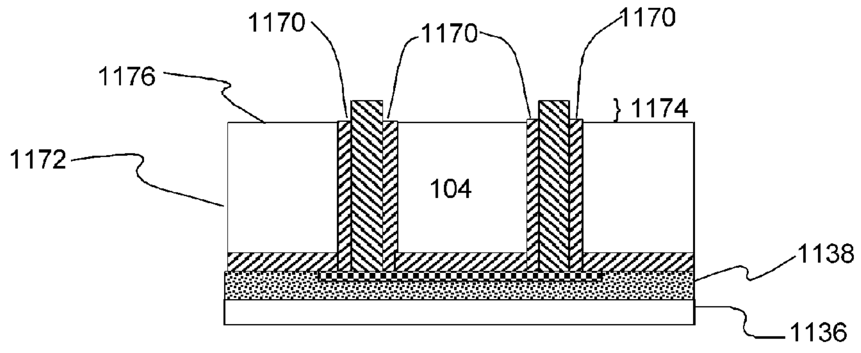
Figure 8D:
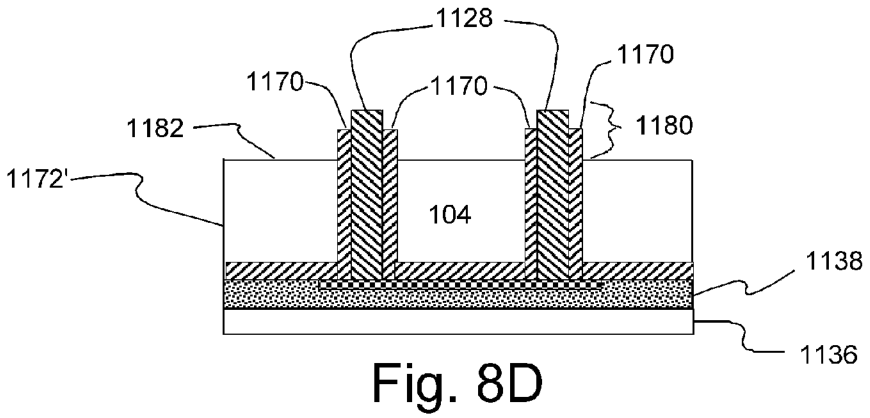

In FIG. 8C both the exposed, now-upper ends of the dielectric casings 1170 and a thin surface portion of the reduced wafer 1172 are removed to expose tips 1174 above wafer 1172 surface 1176. Finally, the wafer 1172 is sub-etched to expose a TSV section 1180 above the sub-etched surface 1182 of the sub-etched wafer 1172'. The metal TSVs 1128 remain encased in dielectric casing 1170. Having defined the TSV probe tips 1128, the probe head may be completed.

If additional top side processing and/or bumping is desired, since it is normally difficult to further process and/or dice thin wafers such as TSV wafers, processing continues substantially as shown for the top side example in FIGS. 7A-B. So, for example, as shown in FIG. 7A a probe side handle layer 1220 is attached 1222 to the sub-etched surface 1182, i.e., at the original bottom. Then, the top side handle layer 1136 and the adhesive layer 1138 are removed. The wafer 1172' is inverted for forming any additional top side surface layer(s), and/or bumping if desired. Then, the wafer 1172' may be diced to separate individual probe heads 100. Once separated, the bottom side handle wafer is removed and individual probe heads 100 may be mounted (e.g., wire bonded or soldered) in a test fixture for use in test probing.

Figure 9A:
FIGS. 9A-C show examples of notched annular probe tips.
Figure 9B:
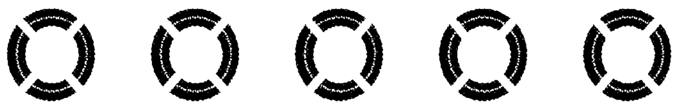
Figure 9C:
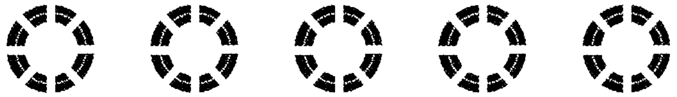

FIGS. 9A-C show examples of notched annular probe tips 104 formed when optional steps 114 and 120 in FIG. 4 are included in probe formation. As noted hereinabove, any cross section may be selected for preferred metal TSVs 104. Annular TSVs 104, e.g., shown in FIG. 2A and formed as described with reference to FIGS. 5A-8D, may be etched to cut notches 130 in the end of the probe tip, e.g., in 1174 in FIG. 8C or 1180', 1180 in FIGS. 6C and 8D. The notches 130 define teeth 132 in the probe tip that facilitate engaging a solder ball or even a chip pad. The notches may be formed by forming a mask (e.g., photoresist or hard mask material) having the selected pattern immediately over the probes on the wafer surface 1130 in FIG. 5C or 1166 in FIG. 8B.

The selected mask pattern is printed on the probes 104, notching the probes as desired, to define tooth shaped probe tips. For a 15-20 μm annulus, for example, the 3-5 μm deep notches 130 are at least 3 μm wide gaps separating circumferential segments 132. Preferably, the 5 μm deep notches 130 are 3 μm gaps in circumferential segments 132. Although the metal may be removed to notch the vias using a suitable dry or wet etch prior to sub-etching the silicon; preferably, notches are etched in the respective casing 1162 or 1170 with sub-etching the silicon surface 1130 or 1166. This exposes the sides of the metal probe tips 1128 for better etch control. Once notching is complete, the mask is removed and probe formation continues as described hereinabove.

Figure 10A:
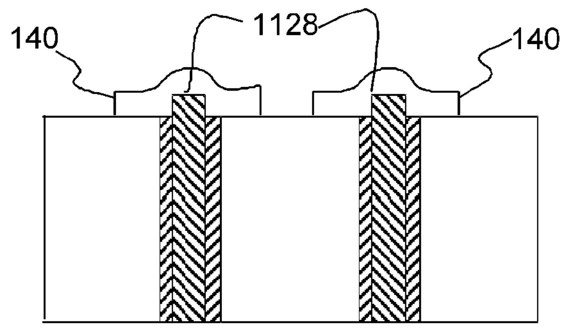
FIGS. 10A-C show stiffening the probe tips with sidewall silicon mounded along the TSV sidewalls.
Figure 10B:
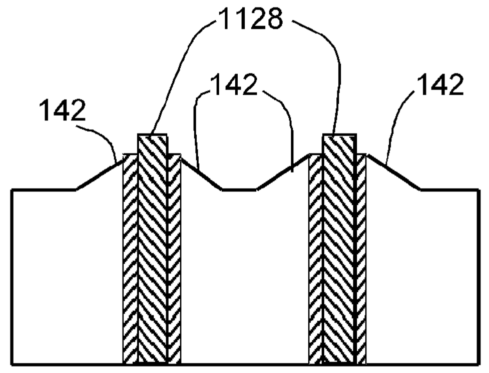
Figure 10C:
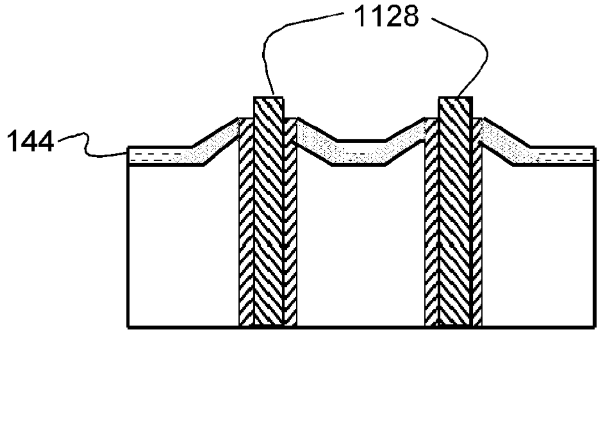

Optionally, FIGS. 10A-C show forming probe tips 104 stiffened with silicon mounded along the TSV sidewalls. First, a mask 140 is formed on the exposed surface 1160 of FIG. 6A, or alternately on the exposed surface 1176 of FIG. 8C. The mask covers the exposed conductive via 1128 ends, the dielectric cases 1162 and adjacent areas of the surface 1160. Then, the wafer is wet or dry etched with a controlled etch to remove the upper portion of the wafer and the mask 140 is removed. As shown in FIG. 10B, the etch is controlled to remove the (expanding) surface as it is exposed, it gradually etches under the mask 140 as it sub-etches the wafer. Thus, silicon mounds 142 form around the exposed probe tips 1128. Finally in FIG. 10C, the surface is insulated with a thin layer of protective oxide 144 on the sub-etched surface. Thereafter, fabrication continues as described for the top and bottom side embodiments with reference to FIGS. 7A-B and 8.

Figure 11A:
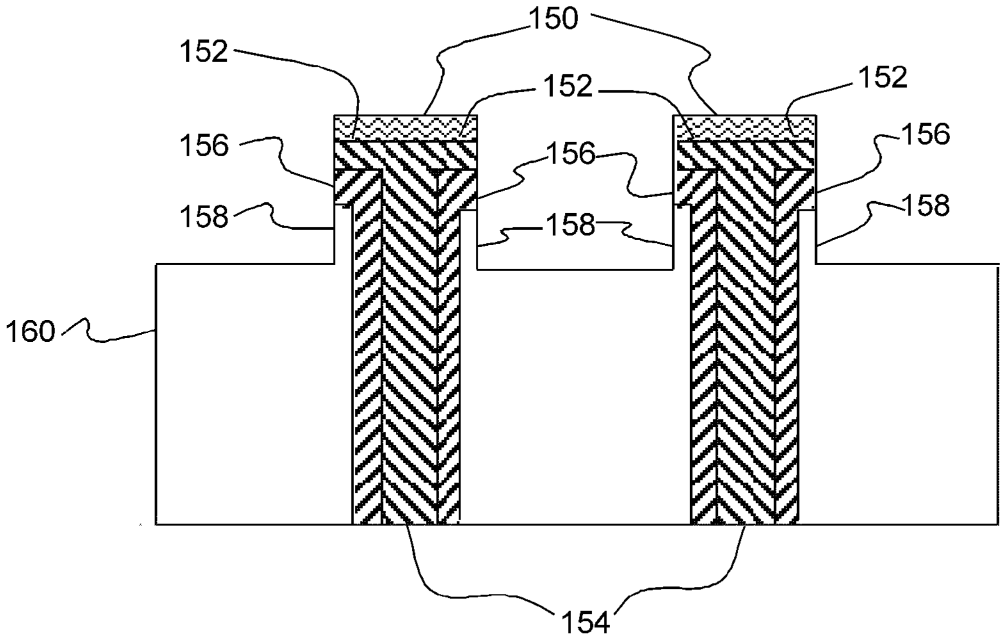
FIGS. 11A-B show optional probe tip formation of nail headed probes in an optional probe embodiment.
Figure 11B:
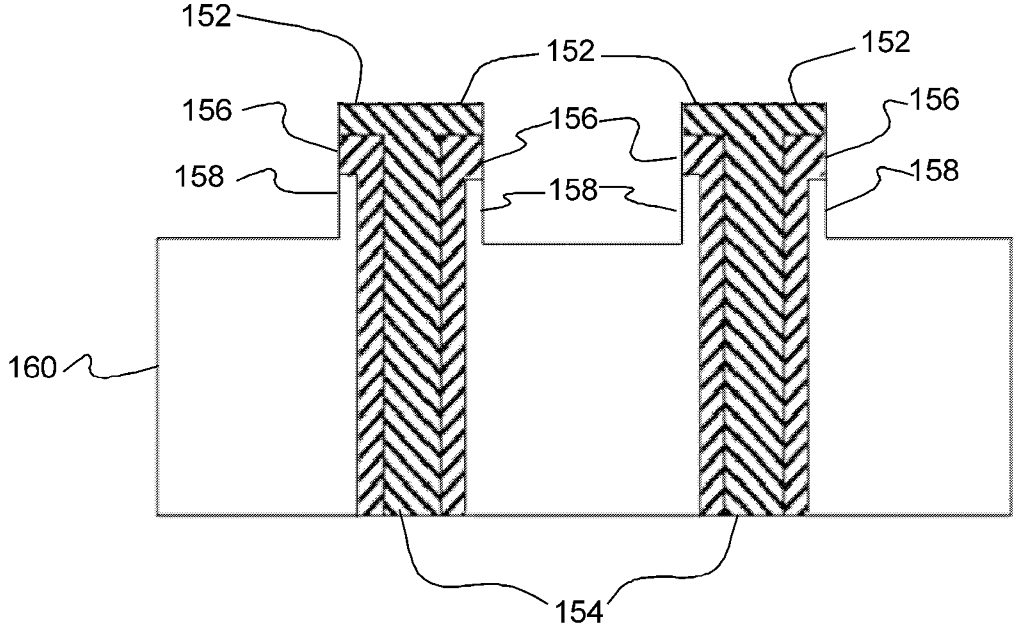
Figure 12A:
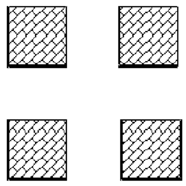
FIGS. 12A-E show examples of additional nail-headed via cross sectional variations.
Figure 12B:
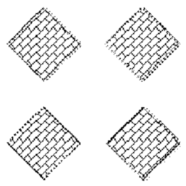
Figure 12C:
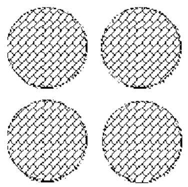
Figure 12D:
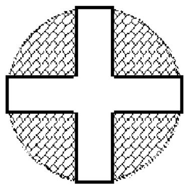
Figure 12E:
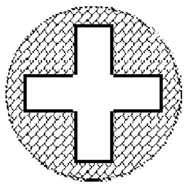

FIGS. 11A-B show optional probe tip formation of nail-headed cross-section probe tips that may be formed by inclusion of optional steps 114 and 120 in an optional probe embodiment. In this embodiment, a mask 150 is formed immediately on layer 1126 in FIG. 5B over the probe vias 1128 and layer 1126 is patterned. Optionally, a hardening metal layer (e.g., tungsten, nickel/gold (Ni/Au), copper, cobalt (Co), chromium (Cr), titanium (Ti), titanium nitride (TiN), tantalum (Ta), tantalum nitride (TaN), or a combination thereof) is formed on layer 1126 and the mask 150 formed on the hardening metal layer. Alternately, a hardening metal layer may be formed on the surface oxide layer 1124 in FIG. 5C or on oxide formed on bottom surface 1166 in FIG. 8B; the mask 150 is formed on that hardening metal layer and the hardening metal layer is patterned.

The patterned metal provides metal flanges 152 extending laterally on either side of the TSVs 154. Thus for the top side example, when the metal layer 1126 and optional hard metal layer is/are removed, the metal flanges 152 remain on the TSVs 154 covering adjacent horizontal portions of the dielectric layer 1124 and adjacent segments of the wafer 1120. After removing the surface metal layer 1126 the mask 150 may be removed or, optionally left in place for subsequent removal. Fabrication proceeds as described hereinabove, removing the surface area of dielectric material layer 1124 and sub-etching the wafer 1120. When the dielectric material layer 1124 is removed in 116 and the wafer is sub-etched in 118, dielectric 156 and silicon 158 remains beneath the flanges 152 along the sidewalls of the TSVs 154 and above the wafer 160. After removing the mask, if not yet removed, fabrication proceeds as described for FIGS. 6C and 7A-B.

FIGS. 12A-E show additional nail head examples of nail-headed via variations, masked 150 and formed as described with reference to FIGS. 11A-B. These additional nail heads are provided for example only. As should be apparent, probe TSVs may have any cross sectional shape, size and pitch, capable of supporting the selected nail head and suitable for probing a given unit. Moreover, as noted hereinabove, TSVs (and probe tips) in an array need not be uniformly shaped or spaced and may be intermixed on a single preferred probe head.

Simply forming an array of vias is relatively simple and cheap as compared to IC formation. Where these TSVs are on pitch that is tens of microns, IC formation typically deals with sub-micron features and pitches. Tungsten probes are known to be reliable and very strong mechanically with good chemical resistance. So, using standard semiconductor manufacturing techniques probes can be formed precisely, cheaply and reliably.

Moreover, although described with reference to probe heads for electrical testing of 2D or 3D fine pitch packaged/unpackaged components, subsystems or systems, preferred TSV structure has much wider application. The TSV structure described hereinabove may be used for mating packaged IC chips, e.g., in fabricating fine pitch sockets. Further, the TSV structure may be used in biomedical applications, e.g., as biomedical electrodes for diagnosis and treatment.

Thus advantageously, preferred TSV probes can be made relatively cheaply for probing ultra-fine pitch pads. Fabrications costs are especially low because the probes are non-critical much larger than minimum shapes on back end layers that may produce numerous probe heads from the same wafer. Because TSVs are fixed in place by surrounding silicon, preferred probe tips are anchored in place tightly aligned. Anchoring the tips reduces lateral movement and maintain alignment. Further, the TSVs have nearly identical height because IC layers are sufficiently uniform that thickness variations are on the order of rounding errors for chip pad and terminating far end of the line steps. Moreover, preferred probe heads are reliable for repeated use, even for thousands to millions of touch downs.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming test probes, said method comprising:

forming a plurality of vias through a semiconductor layer, said plurality of vias defining plurality of probes, a semiconductor core remaining in the center of each of said probe, the plurality of probes being a test head;

etching said semiconductor layer, said plurality of probes extending above the surface of said etched semiconductor layer, portions of probes above said surface being probe tips; and mounting said test head in a test fixture.

2. A method of forming test probes as in claim 1, wherein forming said plurality of vias forms annular vias, each annular via being a probe, and etching said semiconductor layer comprises etching notches in the end of said annular probes, etched said probes having notched tips.

3. A method of forming test probes as in claim 1, wherein etching said semiconductor layer comprises:

masking said surface, said surface remaining exposed at the test head such that the upper end of each via remains exposed; and etching exposed areas, said semiconductor layer being sub-etched in said test head, sub-etching said semiconductor layer defining said probe tips.

4. A method of forming test probes as in claim 1, wherein said semiconductor layer is a silicon wafer and forming said plurality of probes through said semiconductor layer, comprises:

etching a plurality of vias to a selected depth in a surface of said silicon wafer, each of said plurality of vias terminating above the lower surface of said wafer;

oxidizing the sidewalls of said plurality of vias; and filling said plurality of vias with conductive material.

5. A method of forming test probes as in claim 3, wherein etching exposed areas further comprising stiffening said probe tips.

6. A method of forming test probes as in claim 3, wherein before etching said semiconductor layer, stiffening said probe tips comprises:

forming a metal layer on said surface; and patterning said metal layer to said plurality of probes such that a metal cap overlaps all sides of each via extending above said surface.

7. A method of forming test probes as in claim 5, wherein after etching exposed areas stiffening said probe tips comprises building up semiconductor along said probe tips.

8. A method of forming test probes as in claim 6, wherein forming said plurality of probes forms annular probes;

patterning said metal forms an annular cap at each annular probe tip, each annular cap having a smaller inside diameter than the diameter of the semiconductor core and a larger outside diameter than said each annular via; and etching said semiconductor layer leaves semiconductor material along sidewalls of said probe tip capped by a respective annular cap.

9. A method of forming test probe heads for probing integrated circuit (IC) chips, said method comprising:

etching an array of vias to a selected depth in a surface of a semiconductor wafer, each of said vias in said array terminating above the opposite surface of said wafer;

insulating the sidewalls of said vias;

filling said vias with conductive material;

etching said semiconductor wafer at said array, said semiconductor wafer being sub-etched such that said array vias extend from said sub-etched surface, sub-etched via portions being individual test probe tips;

separating said array from said wafer, said separated array being a test head; and mounting said test head in a test fixture.

10. A method of forming test probe heads as in claim 9, wherein said wafer is a silicon wafer, said surface being oxidized with said sidewalls, and filling said vias comprises forming a metal layer on said oxidized surface, said metal layer being said conductive material filling said vias.

11. A method of forming test probe heads as in claim 10, wherein etching said wafer comprises:

removing horizontal portions of said metal layer from said wafer;

removing oxide from said surface;

masking said surface, said surface remaining exposed at the test head such that the upper end of each via remains exposed; and etching said surface in exposed areas, said wafer being sub-etched in said array of vias.

12. A method of forming test probe heads as in claim 10, wherein etching said surface comprises:

masking said metal layer, said metal layer remaining exposed at the test head;

removing unmasked portions of said metal layer from said oxidized surface;

removing exposed oxide from said surface; and etching exposed areas of said wafer, said individual test probe tips being nail headed and said wafer being sub-etched in said array of nail headed test probe tips.

13. A method of forming test probe heads as in claim 10, wherein etching said surface comprises:

removing horizontal portions of said metal layer from said wafer;

attaching a handle layer to oxide on said surface;

removing the portion of said wafer between the bottom of said vias and said other surface, the other end of each via being exposed; and etching said wafer at exposed vias, said wafer being sub-etched at the bottom of said array of vias, the bottom end of said array of vias being probe tips for a probe head.

14. A method of forming test probe heads as in claim 10, wherein forming said plurality of vias forms annular probes and etching said wafer further comprises etching notches in sub-etched said annular test probe tips.

15. A method of forming test probe heads as in claim 11, wherein subsequent to sub-etching said surface, said method further comprises stiffening said individual test probe tips with silicon.

16. A test probe head comprising:

a semiconductor layer;

an array of vias extending though said semiconductor layer, exiting one surface of said semiconductor layer, and defining a plurality of probes, each probe including a semiconductor core, individual via portions above said surface being individual test probe tips; and a redistribution layer connecting individual test probes externally.

17. A test probe head as in claim 16, wherein the semiconductor layer is a silicon layer, each said semiconductor core is a silicon core, and said test probe tips are on a pitch at or less than fifty microns (50 μm).

18. A test probe head as in claim 17, wherein one or more of said plurality of probes is an annular via and the test probe tip of at least one annular test probe is notched.

19. A test probe head as in claim 17, wherein one or more of said vias is a group of vias having a rectangular cross section.

20. A test probe head as in claim 17, wherein silicon sidewalls extends along the dielectric sidewalls of said test probe tips.

21. A test probe head as in claim 20, further comprising a metal cap on each test probe tip, wherein said silicon along the dielectric sidewall of said each test probe tip is capped by said metal cap.

22. A test probe head for probing integrated circuit (IC) chips, said test head comprising:

a silicon layer;

an array of metal vias defining a plurality of individual test probes, on a pitch at or less than fifty microns (50 μm) extending through and exiting one surface of said silicon layer, via portions exiting said one surface being individual test probe tips;

a silicon core in each test probe;

silicon sidewalls extending from one said silicon core along the sidewalls of said test probe tips; and a redistribution layer connecting individual test probes externally.

23. A test probe head as in claim 22, wherein one or more of said individual test probes is an annular via and the test probe tip of at least one annular test probe is notched.

24. A test probe head as in claim 22, wherein one or more of said individual test probes is a group of vias separated by said silicon core and each having a rectangular cross section.

25. A test probe head as in claim 24, further comprising a tungsten cap on each test probe tip, said tungsten cap capping said silicon sidewalls along the sidewall of said each test probe tip.

* * * * *